(12) United States Patent
Talin et al.

(10) Patent No.: US 12,366,881 B1
(45) Date of Patent: Jul. 22, 2025

(54) PROGRAMMING ANALOG MEMORY ELEMENTS IN A NEOMORPHIC COMPUTING SYSTEM

(71) Applicant: National Technology & Engineering Solutions of Sandia, LLC, Albuquerque, NM (US)

(72) Inventors: Albert Alec Talin, Dublin, CA (US); Elliot James Fuller, Livermore, CA (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 1004 days.

(21) Appl. No.: 17/408,806

(22) Filed: Aug. 23, 2021

(51) Int. Cl.
| | | |
|---|---|---|
| *G06E 3/00* | (2006.01) | |
| *G11C 13/00* | (2006.01) | |
| *G11C 27/00* | (2006.01) | |
| *G11C 27/02* | (2006.01) | |
| *H10B 63/00* | (2023.01) | |
| *H10D 84/90* | (2025.01) | |

(52) U.S. Cl.
CPC .......... *G06E 3/008* (2013.01); *G11C 13/0007* (2013.01); *G11C 27/00* (2013.01); *G11C 27/005* (2013.01); *G11C 27/022* (2013.01); *H10B 63/22* (2023.02); *G11C 2207/101* (2013.01); *H10D 84/942* (2025.01)

(58) Field of Classification Search
CPC ..... G06E 3/008; G11C 13/0007; G11C 27/00; G11C 27/005; G11C 27/022; G11C 2207/101; H10B 63/22; H01L 2027/11842
See application file for complete search history.

(56) References Cited

U.S. PATENT DOCUMENTS

| | | |
|---|---|---|
| 5,315,131 A | 5/1994 | Kishimoto et al. |
| 6,653,193 B2 | 11/2003 | Gilton |
| 6,992,323 B2 | 1/2006 | Krieger et al. |
| 10,429,343 B1 | 10/2019 | Talin et al. |
| 10,497,866 B1 | 12/2019 | Fuller et al. |
| 2014/0150859 A1 | 6/2014 | Zakhidov et al. |
| 2014/0268998 A1* | 9/2014 | Jo ................. H10N 70/011 257/4 |
| 2015/0325278 A1 | 11/2015 | Bauer et al. |
| 2015/0340089 A1* | 11/2015 | Stojcevska ......... G11C 13/0097 365/163 |

(Continued)

*Primary Examiner* — Donald H B Braswell
(74) *Attorney, Agent, or Firm* — Calfee, Halter & Griswold LLP; Madelynne J. Farber; Samantha Updegraff

(57) ABSTRACT

A method is disclosed herein which includes obtaining an array of analog memory elements. It also includes programming an analog memory element included in the array, where prior to being programmed the analog memory element has a first value for an electrical property, and where it is programmed to cause the analog memory element to perform a computation included in a series of computations performed by the array. Programming the analog memory element includes applying light or heat to the analog memory element, where a value of the electrical property is changed from the first value to a second value based upon application of light or heat to the analog memory element, and further where upon the value of the electrical property being changed from the first value to the second value, the analog memory element is configured to perform the computation responsive to receipt of an input.

18 Claims, 4 Drawing Sheets

(56) References Cited

U.S. PATENT DOCUMENTS

| | | | |
|---|---|---|---|
| 2016/0104841 A1* | 4/2016 | Ahn | H10N 70/066 |
| | | | 438/382 |
| 2016/0336065 A1* | 11/2016 | Lee | G11C 13/0069 |
| 2019/0013465 A1* | 1/2019 | Ha | H10N 70/826 |
| 2019/0378566 A1* | 12/2019 | Boniardi | G11C 11/5678 |
| 2022/0180924 A1* | 6/2022 | Snyder | G11C 13/004 |

* cited by examiner

PROGRAMMING ANALOG MEMORY ELEMENTS IN A NEOMORPHIC COMPUTING SYSTEM

STATEMENT OF GOVERNMENTAL INTEREST

This invention was made with Government support under Contract No. DE-NA0003525 awarded by the United States Department of Energy/National Nuclear Security Administration. The U.S. Government has certain rights in the invention.

BACKGROUND

Computer-implemented artificial intelligence (AI) technologies are permeating throughout everyday lives of humans. For example, modern smart phones have unprecedented capabilities to understand human speech in multiple different languages, and are further configured to provide information and/or services based upon understood speech. In another example, autonomous vehicles (AVs) are being developed to recognize objects in their environments based upon sensor signals output by sensor systems of the AVs (such as lidar systems, camera systems, radar systems, etc.), and can autonomously maneuver in their environments based upon locations and types of recognized objects. Further progress in computer-implemented AI technologies, however, is impeded due to limitations in hardware that is employed to perform computations inherent in AI technologies.

For example, embedded devices, such as sensors, require low-power operation, while computer processors conventionally used to perform AI-related computations are typically power-hungry. In addition, AI-related computations, in many scenarios, must be performed very quickly. Combining the requirements of low energy and high-speed is a challenge for existing complementary metal oxide semiconductor (CMOS) hardware.

Technologies related to neomorphic computing have recently been developed, where neomorphic computing systems can perform AI-related computations quickly while consuming a relatively small amount of power. Neomorphic computing is an emerging area of computing technology that is well-suited to efficiently perform operations associated with computer-implemented AI. In a neomorphic computing system, analog memory elements are configured to perform in-memory computing. In-memory computing is an emerging computing paradigm where physical attributes of analog memory elements are exploited to perform computational tasks within the memory elements themselves, thus eliminating the need to transfer data between memory and processing units. For instance, when analog memory elements are organized in dense arrays, such analog memory elements can implement a matrix-vector multiplication operation by leveraging laws of physics. With more particularity, resistance of analog memory elements can be tuned to provide analog stable states, thus providing an ability to memorize neural network weights into phase configurations of such elements. When a voltage is applied to a single analog memory element, a current that is equivalent to the product of the voltage and conductance flows. When voltages are applied on all rows of the array, parallel summation of all of the single products results. Put differently, Ohm's law and Kirchhoff's law enable fully-parallel propagation through fully-connected networks, strongly accelerating existing approaches for AI computations that are based upon CPUs and GPUs.

From the foregoing, it can be ascertained that tuning conductance (and thus resistance) of analog memory elements precisely is a requirement for in-memory computing applications. Conventionally, tuning the analog memory elements has been accomplished electrochemically. Tuning analog memory elements electrochemically, however, has several drawbacks. First, electrochemically tuning of analog memory elements requires complexity on a microchip that includes the memory elements that otherwise would not exist. Further, utilizing electrochemical approaches to tune conductance of analog memory elements has limited scale, thereby limiting the ability of the analog memory array to perform complex computations. Finally, tuning analog memory elements electrochemically imposes thermal management constraints on a chip that includes the array of analog memory elements.

SUMMARY

The following is a brief summary of subject matter that is described in greater detail herein. This summary is not intended to be limiting as to the scope of the claims.

Described herein are various technologies pertaining to neomorphic (in-memory) computing. With more particularly, technologies related to tuning an electrical property of analog memory elements in a neomorphic computing system are described herein. The analog memory elements can be microresistors that are formed of one or more transition metal oxides, such as $TiO_x$, $WO_x$, $VO_x$, $NbO_x$, etc., which are known to exhibit sub-stoichiometric compositions. In another example, the analog memory elements can be metal oxides. In yet another example, the analog memory elements can be formed of silicon oxide or some other suitable oxide. Rather than tuning (programming) an analog memory element through electrochemical processes, the analog memory element is tuned by way of application of light and/or heat to the analog memory element. When the analog memory element is placed in a reducing environment, it has been observed that application of light and/or heat promotes reactions required for insertion of ions into the analog memory element and/or removal of oxygen vacancies from the analog memory element, thereby tuning the underlying electronic structure of the analog memory element (and thus tuning the resistance of the analog memory element). Each analog memory element in a dense array of analog memory elements can be individually tuned through application of light and/or heat onto the respective memory element. Wavelength of the light, intensity of the light, and/or amount of time that light is applied to an analog memory element can be controlled to cause the analog memory element to have a desired resistance (and thus conductance). In another example, application of heat and/or light to analog memory elements can initiate phase changes in the analog memory elements, and therefore the resistance of the material can be altered by way of phase change (where oxides are an example phase change material). For instance, titanium oxide is an oxide that can undergo phase change.

An advantage of tuning analog memory elements, as described herein, over electrochemically tuning analog memory elements is that the tuning is reversible. For instance, after a dense array of analog memory elements has been tuned to perform a computational task, the tuning can be reversed by placing the analog memory array into an oxidative environment, which results in electrical structures of analog memory elements in the array to their original forms. The analog memory elements in the array can then be reprogrammed to perform an updated computational task.

Pursuant to an example, the analog memory elements can be tuned by way of application of light and/or heat thereto to perform a matrix vector computation, which is often performed when undertaking deep neural network (DNN) related computations. If the DNN is retrained (e.g., weights of the DNN are updated), resulting in changed weights on edges of the DNN, the array of analog memory elements can be retuned through use of the technologies described herein to represent the updated weights of the DNN.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Figure 1:
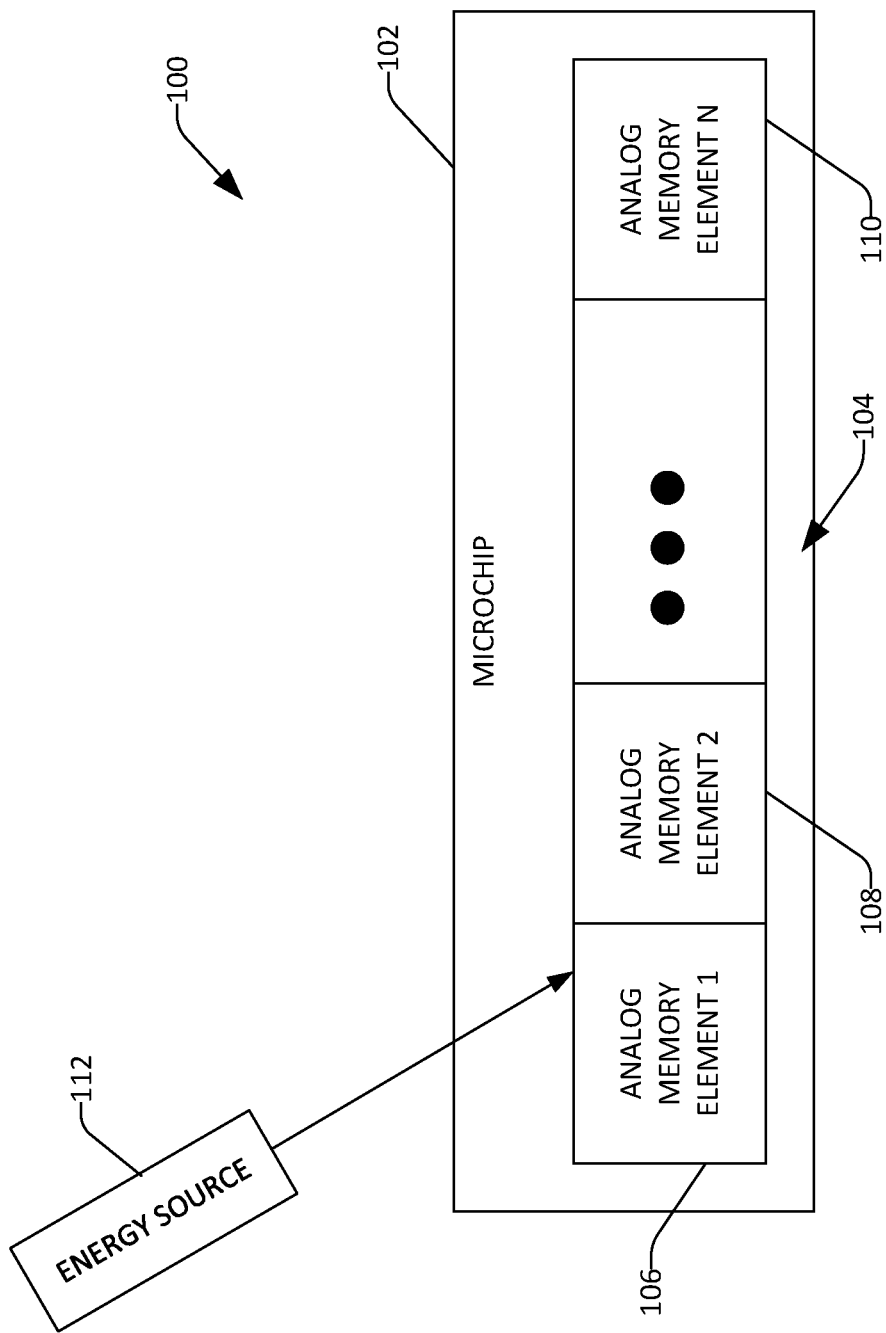
FIG. 1 is a schematic that illustrates analog memory elements being tuned by way of application of light and/or heat thereto.

Various technologies pertaining to neomorphic (in-memory) computing are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects. Further, it is to be understood that functionality that is described as being carried out by certain system components may be performed by multiple components. Similarly, for instance, a component may be configured to perform functionality that is described as being carried out by multiple components.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form. Additionally, as used herein, the term "exemplary" is intended to mean serving as an illustration or example of something, and is not intended to indicate a preference.

Described herein are various technologies pertaining to a neomorphic computing system, where the neomorphic computing system includes a dense array of analog memory elements. Analog memory elements in the dense array have been tuned by way of application of light and/or heat thereto. Also described herein are technologies related to tuning analog memory elements that are to be employed in a neomorphic computing system. The technologies described herein exhibit various advantages over conventional approaches for tuning analog memory elements, where the conventional approaches involve tuning such elements electrochemically. For instance, in contrast to conventional approaches, tuning analog memory elements by way of application of light and/or heat thereto is not associated with increased circuit complexity, does not limit scalability, and does not impose restrictive thermal management constraints on a microprocessor chip that includes the analog memory elements. Rather, tuning analog memory elements using the technologies described herein is associated with improved scalability, reduction in circuit complexity, while retaining complementary metal oxide semiconductor (CMOS) compatibility. Pursuant to an example, analog memory elements in a dense array of analog memory elements can be tuned to perform portions of a relatively complex computation, such as a matrix vector computation, which is typically performed in artificial intelligence (AI) related computations. For instance, the dense array of analog memory elements is programmed to represent a deep neural network (DNN) that has nodes and edges, where electrical conductance (and thus resistance) is tuned in analog memory elements in the dense array to represent weights assigned to edges of the DNN.

With reference now to FIG. 1, an example system 100 that is configured to tune (program) analog memory elements in a dense array of analog memory elements is illustrated. As indicated previously, the dense array of analog memory elements can be included in a neomorphic computing system, where in-memory computing occurs in analog memory elements. The system 100 includes a microchip 102, where the microchip 102 includes an array 104 of analog memory elements. The array 104 of analog memory elements includes analog memory elements 1-N (denoted respectively by reference numerals 106-110). The analog memory elements 106-110 can be composed of a transition metal oxide, such as $TiO_x$, $WO_x$, $VO_x$, $NbO_x$, etc., which are known to exhibit sub-stoichiometric compositions. Further, the analog memory elements 106-110 can be formed of combinations of such transition metal oxides. In yet another example, the analog memory elements 106-110 can be formed of metal oxides, such as titanium oxide, aluminum oxide, etc., although other metal oxides are contemplated. In still yet another example, the analog memory elements 106-110 can be formed of an oxide such as silicon oxide. Each analog memory element in the array 104 can be composed of the same material. Prior to being programmed, the analog memory elements 106-110 may have a first value for an electrical property. In an example, the electrical property may be resistance, capacitance, inductance, etc.

Prior to being programmed, each of the analog memory elements 106-110 may have approximately the same value for the electrical property. In another example, prior to being programmed, two or more of the analog memory elements in the array 104 may have different values for the electrical property. Pursuant to an example, the analog memory elements 106-110 are microresistors, and the electrical property of the microresistors that is tunable is resistance.

The system 100 further includes an energy source 112 that is configured to direct light and/or heat to analog memory elements in the array 104, where application of light and/or heat to an analog memory element causes an alteration in underlying electrical structure of the analog memory element, resulting in an alteration to the value of the electrical property of the analog memory element. In an example, the energy source 112 is a laser that is configured to direct a beam of light at an individual analog memory element in the analog memory elements 106-110. As illustrated in FIG. 1, the energy source 112 is directing light and/or heat towards the first analog memory element 106. Prior to having light and/or heat applied thereto, the first analog memory element 106 has a first value of resistance. Subsequent to the first analog memory element 106 having light and/or heat applied thereto, the first analog memory element 106 has a second value of resistance that is different from the first value of resistance. As noted previously, upon having light and/or heat applied thereto, the electrical structure of the first analog memory element 106 may be altered, thereby altering resistance of the first analog memory element 106. In another example, upon having light and/or heat applied thereto, phase of the material of the first analog memory element 106 may be altered, thereby altering resistance of the first analog memory element 106. Upon the resistance of the first analog memory element 106 being tuned to a desired resistance, the energy source 112 can be configured to direct light and/or heat to the second analog memory element 108, such that resistance of the second analog memory element 108 is tuned to a desired resistance. Therefore, the energy source 112 can sequentially apply light and/or heat to memory elements in the array 104. In another example, an array of energy sources can be configured to apply light and/or heat simultaneously to multiple analog memory elements in the array 104.

In an example, in connection with altering the underlying electrical structure of an analog memory elements in the array (e.g., the first analog memory element 106) and/or altering phase of material of the analog memory elements in the array, the energy source 112 can be configured to emit light of a particular wavelength. For instance, the energy source 112 is configured to emit light having a wavelength that is between 500 nm and 600 nm. In another example, the energy source 112 is configured to emit light having a wavelength between 400 nm and 500 nm. In yet another example, the energy source 112 is configured to emit light having a wavelength of between 600 nm and 700 nm.

Further, in connection with altering the underlying electrical structure of the first analog memory element 106 and/or altering phase of the material of the first analog memory element 106, the energy source 112 can be configured to emit light having a particular luminance. In an example, when the resistance of the first analog memory element 106 is to be tuned to a first resistance, the energy source 112 can emit light having a first luminance, while when the resistance of the first analog memory element 106 is to be tuned to a second resistance, the energy source 112 can be configured to emit light with a second luminance that is different from the first luminance. The higher the luminance, the more change in resistance to an analog memory element that has light applied thereto.

Moreover, the energy source 112 can be configured to direct light and/or heat towards the first analog memory element 106 for a particular amount of time, depending upon the desired resistance of the first analog memory element 106. In an example, the energy source 112 is configured to emit light and/or heat for a first amount of time when the resistance of the first analog memory element 106 is to be tuned to a first resistance, and the energy source 112 is configured to emit light and/or heat for a second amount of time when the resistance of the first analog memory element 106 is to be tuned to a second resistance. It is therefore to be understood that one or more of light wavelength, luminance, and duration of application of light and/or heat can be controlled to tune resistance of an analog memory element to a desired resistance.

As described previously, the array of analog memory elements 104 can be programmed to perform computations relating to an AI application, such as a matrix vector computation. Therefore, the first analog memory element 106 can be programmed to perform a first portion of a computation upon receipt of input (e.g., a voltage applied across the first analog element 106), the second analog memory element 108 can be configured to perform a second portion of the computation upon receipt of input, and the Nth analog memory element 110 can be configured to perform an Nth portion of the computation upon receipt of input. Therefore, once programmed, the first analog memory element 106 may have a first resistance, the second analog memory element 108 may have a second resistance, and the Nth analog memory element 110 may have a third resistance, where the first resistance, the second resistance, and the third resistance are non-identical. In another example, at least two of the analog memory elements in the array 104 may be programmed to have identical resistances.

Figure 2:
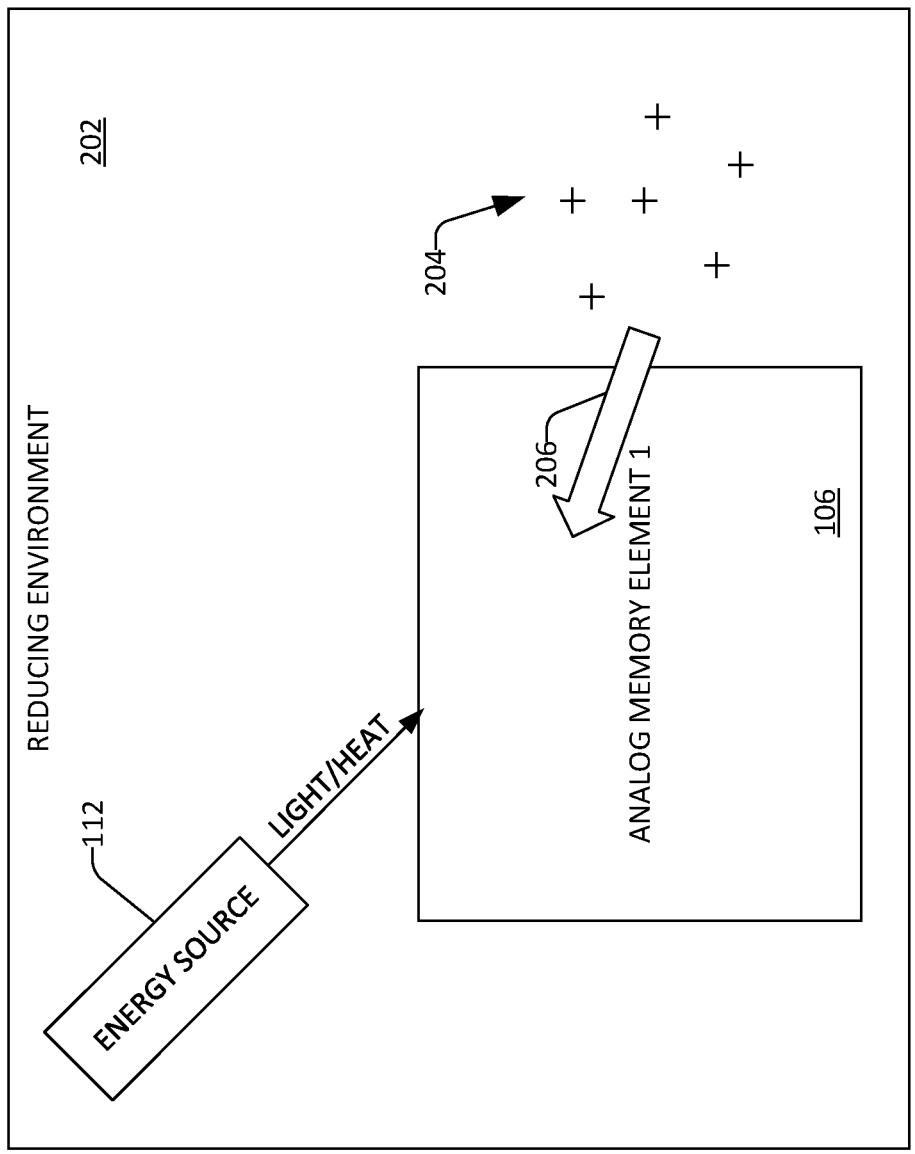
FIG. 2 is a schematic that illustrates a metal oxide analog memory element being doped with ions upon application of light and/or heat to the analog memory element.

Now referring to FIG. 2, a schematic that depicts an example programming of the first analog memory element 106 is illustrated. As illustrated in FIG. 2, the energy source 112 and the first analog memory element 106 are placed in a reducing environment 202. In the reducing environment, oxygen is removed (as well as other oxidizing gases or vapors), thereby preventing oxidation. In an example, the reducing environment 202 can include a partial pressure of hydrogen. When light and/or heat is applied to the first analog memory element 106 by the energy source 112, the first analog memory element 106 may become doped with hydrogen ions 204 that exist within the reducing environment 202, as illustrated by arrow 206. Doping of the first analog memory element 106 with the hydrogen ions results in an alteration of resistance of the first analog memory element 106 from a first resistance to a second resistance. As indicated previously, the energy source 112 can emit light and/or heat at a particular wavelength, a particular intensity, and for a particular amount of time in order to cause the resistance of the first analog memory element 106 to alter from a first resistance to a second (desired) resistance.

In another example, application of light and/or heat to the first analog memory element 106 when placed in the reducing environment 202 can result in reduction of oxygen vacancies in the first analog memory element 106. Such reduction in oxygen vacancies results in an alteration of resistance in the first analog memory element 106 from a first resistance to a second resistance. An advantage of the approaches described herein is that the tuning of the first analog memory element 106 is reversible. More specifically, subsequent to the first analog memory element 106 being tuned, the first analog memory element 106 can be placed in an oxidative environment, which can result in return of oxygen vacancies in the first analog memory element 106 (and thus the return of the resistance of the first analog memory element 106 from the second resistance to the first resistance).

Figure 3:
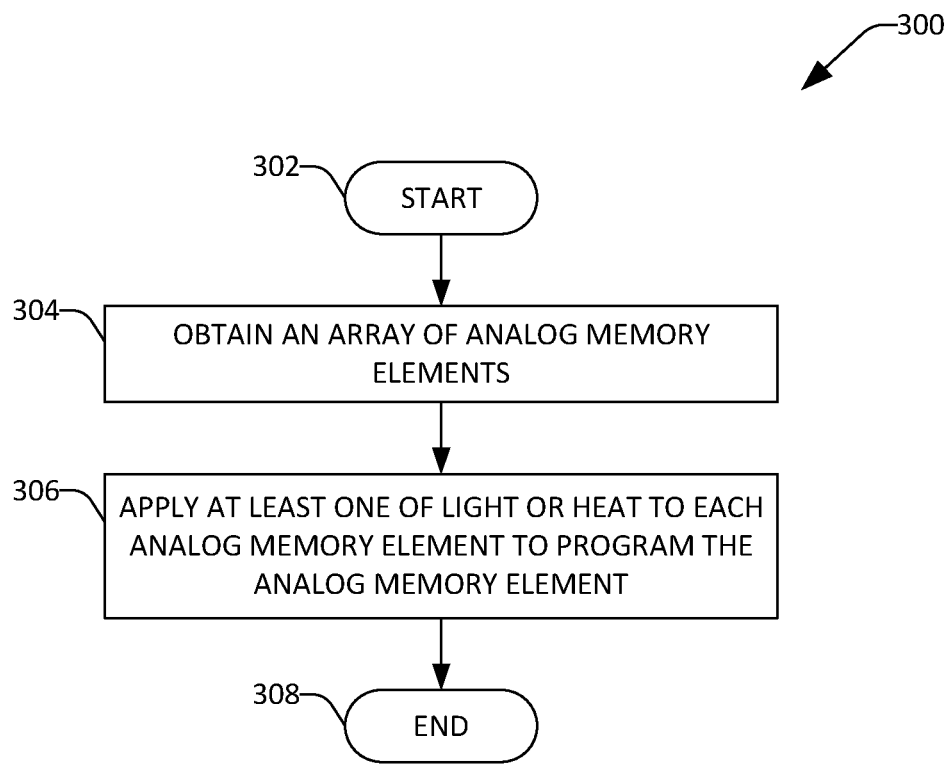
FIG. 3 is a flow diagram illustrating an example methodology for programming an analog memory element by way of application of light and/or heat to the analog memory element.
Figure 4:
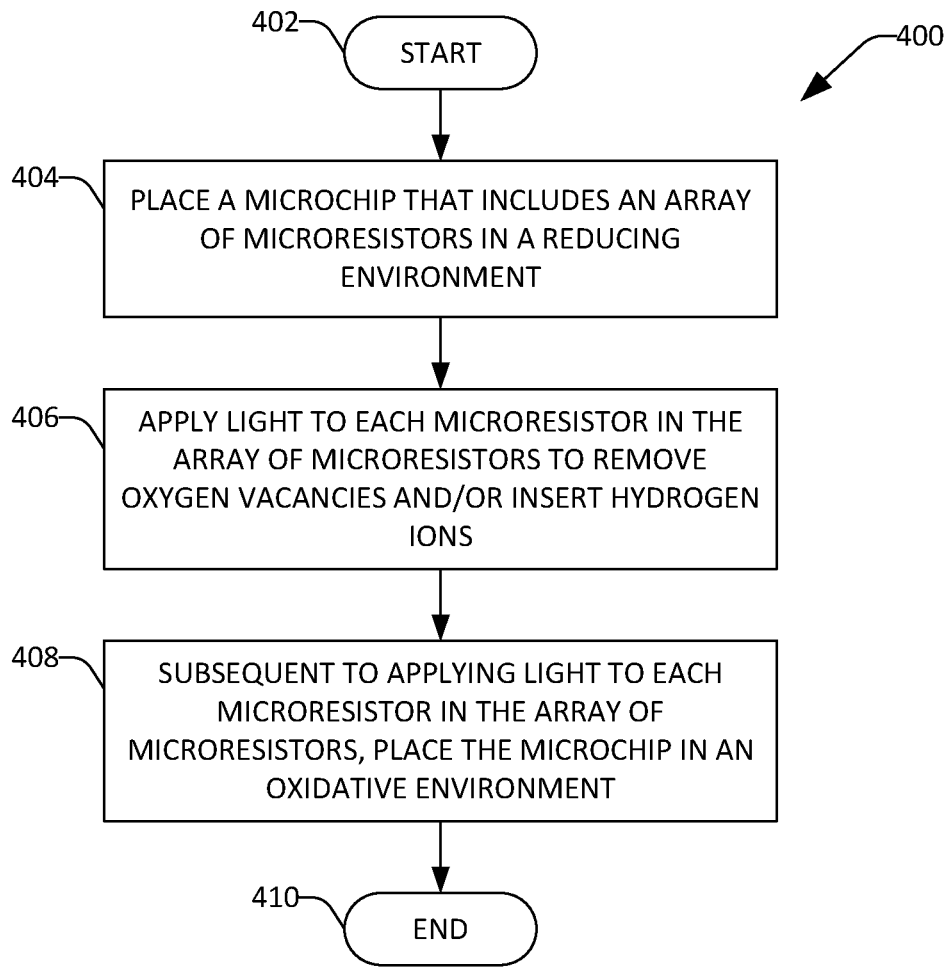
FIG. 4 is a flow diagram illustrating a methodology for programming and subsequently reprogramming an array of microresistors that are used in a neomorphic computing system.

FIGS. 3 and 4 illustrate methodologies relating to tuning analog memory elements, where tuned analog memory elements are included in a neomorphic computing system. While the methodologies are shown and described as being a series of acts that are performed in a sequence, it is to be understood and appreciated that the methodologies are not limited by the order of the sequence. For example, some acts can occur in a different order than what is described herein. In addition, an act can occur concurrently with another act. Further, in some instances, not all acts may be required to implement a methodology described herein.

Now referring to solely to FIG. 3, a flow diagram illustrating an example methodology 300 for programming an analog memory element to perform a portion of a computational task is illustrated. The methodology 300 starts at 302, and at 304 an array of analog memory elements is obtained, where the array of analog memory elements includes analog memory elements composed of a metal oxide. At 306, an analog memory element included in the array of analog memory elements is programmed, where prior to being programmed the analog memory element has a first value for an electrical property (resistance), and further where the analog memory element is programmed to cause the analog memory element to perform a computation that is included in a series of computations performed by the array of analog memory elements. Programming the analog memory element includes applying at least one of heat or light to the analog memory element, where a value of the electrical property is changed from the first value to a second value based upon application of the at least one of the light or the heat to the analog memory element. Upon the value of the electrical property being changed from the first value to the second value, the analog memory element is configured to perform the computation responsive to receipt of an input (responsive to a voltage being applied across the analog memory element). The methodology 300 completes at 308.

Turning now to FIG. 4, a flow diagram illustrating an example methodology 400 for reprogramming an array of analog memory elements is illustrated. The methodology 400 starts at 402, and at 404 a microchip that includes an array of microresistors is placed in a reducing environment. At 406, light (e.g., green light) is applied to each microresistor in the array of microresistors to remove oxygen vacancies therefrom and/or to insert hydrogen ions therein. Hence, through application of the light to the microresistors, resistances of such microresistors are altered to desired resistances.

At 408, subsequent to light being applied to each microresistor in the array of microresistors, the microchip is placed in an oxidative environment. This results in the array of microresistors being reprogrammed to their initial state, such that the resistances can again be altered. This may occur when the microchip has been placed in operation and subsequently needs to be reprogrammed due to additional data being received and/or due to the microchip being employed in a different application. The methodology 400 completes at 410.

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim

What is claimed is:

1. A method comprising:
    obtaining an array of analog memory elements;
    programming an analog memory element that is included in the array of analog memory elements, wherein prior to being programmed the analog memory element has a first value for an electrical property, and further wherein the analog memory element is programmed to cause the analog memory element to perform a computation that is included in a series of computations performed by the array of analog memory elements, wherein programming the analog memory element comprises:
    applying at least one of light or heat to the analog memory element, wherein the at least one of the light or the heat is directed at the analog memory element by a laser during programming of the analog memory element, wherein at least one light is applied, and further wherein the light has a wavelength of between 500 nm and 600 nm, wherein a value of the electrical property is changed from the first value to a second value based upon application of the at least one of the light or the heat to the analog memory element, and further wherein upon the value of the electrical property being changed from the first value to the second value, the analog memory element is configured to perform the computation responsive to receipt of an input.

2. The method of claim 1, wherein the electrical property is resistance.

3. The method of claim 1, wherein both light and heat are applied to the analog memory element.

4. The method of claim 1, wherein applying at least one of light or heat to the analog memory element comprises applying green laser light to the analog memory element.

5. The method of claim 1, wherein the analog memory element is formed of a transition metal oxide.

6. The method of claim 1, wherein the analog memory element is formed of silicon oxide.

7. The method of claim 1, wherein programming the analog memory element further comprises:
    placing the analog memory element in a reducing environment that comprises ions of an element, wherein applying the at least one of light or heat to the analog memory element causes the ions to be inserted into the analog memory element.

8. The method of claim 1, wherein programming the analog memory element further comprises:
    placing the analog memory element in a reducing environment, wherein applying the at least one of light or heat to the analog memory element causes oxygen vacancies to be removed from the analog memory element.

9. The method of claim 1, wherein the analog memory element is formed of $TiO_2$ anatase.

10. The method of claim 1, wherein the computation is a portion of a matrix-vector multiplication.

11. A system that is configured to program an array of analog memory elements such that the array of analog memory elements, when programmed, is configured to perform a computation, the system comprising:
    the array of analog memory elements, wherein the array of analog memory elements includes an analog memory element, wherein the analog memory element has a first value for an electrical property of the analog memory element;

an energy source that is configured to emit at least one of heat or light towards the analog memory element, wherein upon the heat or light emitted by the energy source impacting the analog memory element a value of the electrical property of the analog memory element is changed from the first value to a second value, further wherein once the value of the electrical property of the analog memory element is changed from the first value to the second value the analog memory element is configured to perform a portion of the computation upon receipt of input, and further wherein the energy source is a laser configured to direct the at least one of the heat or the light at the analog memory element during programming of the analog memory element, and further wherein the energy source is configured to emit light having a wavelength between 500 nm and 600 nm towards the analog memory element in order to program the analog memory element.

12. The system of claim 11, wherein the energy source is configured to sequentially direct the at least one of heat or light to several analog memory elements in the array of analog memory elements in order to program the analog memory elements.

13. The system of claim 11, wherein the electrical property is resistance.

14. The system of claim 11, wherein each analog memory element in the array of analog memory elements is composed of a transition metal oxide.

15. The system of claim 11, wherein each analog memory element in the array of analog memory elements is composed of silicon oxide.

16. The system of claim 11, wherein the energy source is configured to direct both light and heat towards the analog memory element.

17. The system of claim 11, wherein the computation is a matrix-vector multiplication.

18. An array of programmable analog memory elements, wherein the array comprises:

a first analog memory element that has been programmed to perform a first portion of a computation, wherein the first analog memory element has a first resistance that has been set based upon the first analog memory element being subjected to first light incident having a wavelength of between 500 nm and 600 nm thereon in a reducing environment; and a second analog memory element that has been programmed to perform a second portion of the computation, wherein the second analog memory element has a second resistance that has been set based upon the second analog memory element being subjected to second light incident thereon in the reducing environment.

* * * * *